(12) United States Patent
Hallivuori et al.

(10) Patent No.: US 7,015,763 B1
(45) Date of Patent: Mar. 21, 2006

(54) DIGITAL TUNING OF A VOLTAGE CONTROLLED OSCILLATOR OF A PHASE LOCKED LOOP

(75) Inventors: Juha Hallivuori, Tampere (FI); Pauli Seppinen, Espoo (FI); Mika Salmi, Turku (FI)

(73) Assignee: Nokia Corporation, Espoo (FI)

( * ) Notice: Subject to any disclaimer, the term of this patent is extended or adjusted under 35 U.S.C. 154(b) by 26 days.

(21) Appl. No.: 10/931,050

(22) Filed: Aug. 30, 2004

(51) Int. Cl.
*H03L 7/087* (2006.01)
*H03L 7/18* (2006.01)

(52) U.S. Cl. .................... 331/11; 331/16; 331/17; 331/25

(58) Field of Classification Search ............... 331/1 A, 331/10, 11, 16–18, 25; 327/156–159; 332/127; 360/51; 375/376; 455/260
See application file for complete search history.

(56) References Cited

U.S. PATENT DOCUMENTS

| | | | |
|---|---|---|---|
| 4,272,729 A | 6/1981 | Riley, Jr. | |
| 4,580,107 A | 4/1986 | Caldwell et al. | |
| 5,015,970 A | 5/1991 | Williams et al. | |
| 5,363,419 A | 11/1994 | Ho | |
| 5,487,093 A | 1/1996 | Adresen et al. | |
| 5,955,928 A * | 9/1999 | Smith et al. | ........ 331/2 |
| 6,545,545 B1 | 4/2003 | Fernandez-Texon | |
| 6,639,474 B1 | 10/2003 | Asikainen et al. | |

* cited by examiner

*Primary Examiner*—David Mis

(57) ABSTRACT

This invention describes a method for a component/system level design of an adaptive radio receiver in electronic communication devices (e.g., mobile phones) by providing an automatic digital tuning of a voltage controlled oscillator of a phase locked loop (PLL) instead of a prior-art pre-calibration. A normal PLL for frequency locking is used which does not need any additional pre-calibration blocks to account for different temperatures or any other extreme conditions. If the current switch setting does not allow the locking, i.e., the VCO output signal frequency is still far away from a reference frequency, the PLL "coarse" tuning will cause the switch condition to change and bring the frequency within a reasonable range using an additional phase detector PD2 loop.

28 Claims, 5 Drawing Sheets

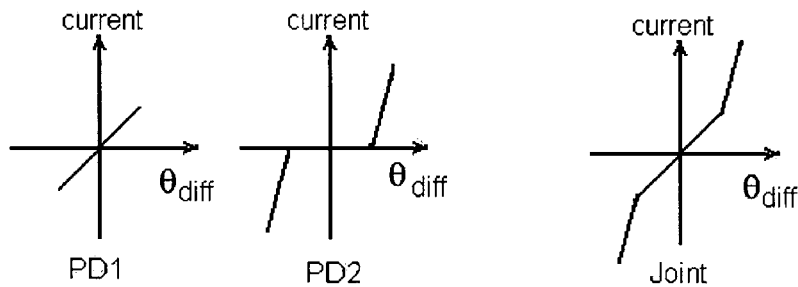
Figure 4a  Figure 4b  Figure 4c
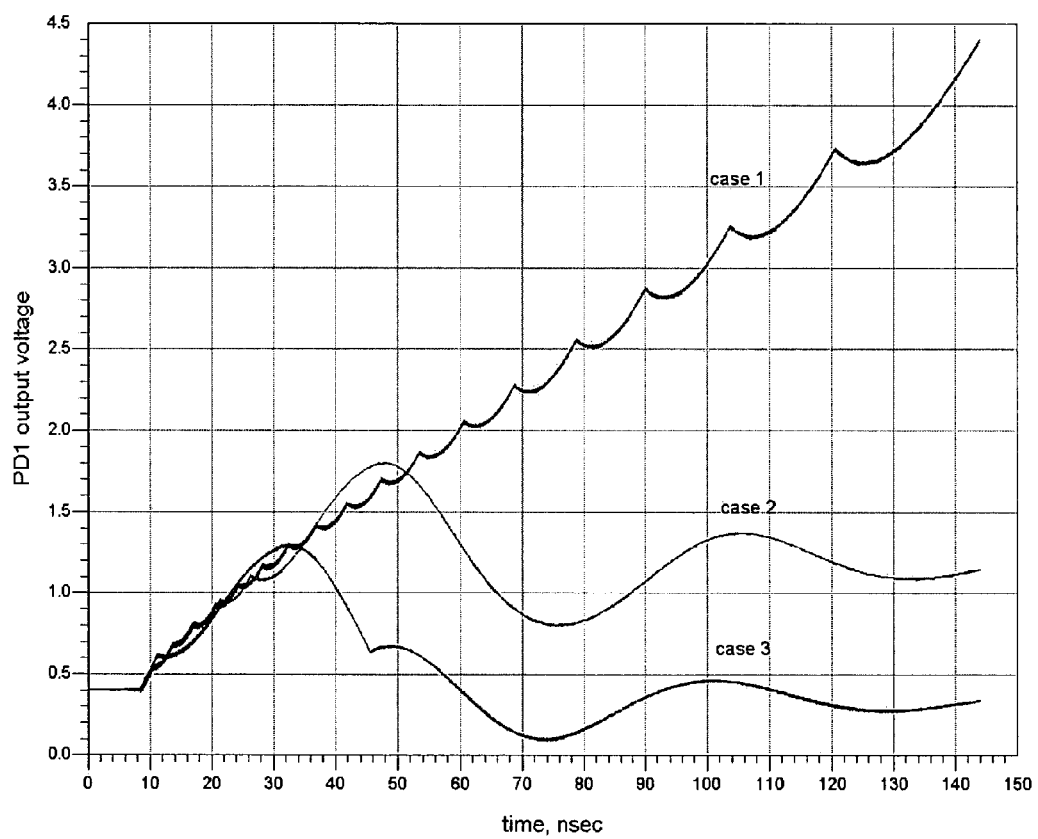
Figure 5a

DIGITAL TUNING OF A VOLTAGE CONTROLLED OSCILLATOR OF A PHASE LOCKED LOOP

TECHNICAL FIELD

This invention generally relates to electronic communication devices (e.g., mobile phones) and more specifically to a component/system level design of an adaptive radio receiver by providing a digital tuning of a voltage controlled oscillator of a phase locked loop.

BACKGROUND ART

An on-chip design requires large process variation compensation, when VCO (voltage control oscillator) design is used. At frequencies up to several GHz, the ±10% variation in the values of capacitances can cause 300 MHz to 500 MHz variations in the frequency. These variation levels may require an integrated VCO frequency range to exceed many times the actual wanted frequency range because, for example, WCDMA (wideband code-division multiple access) band is only 120 MHz at a double operation frequency. Then the needed process-variation-calibration is now done with switchable capacitors at the VCO core. These switches need a digital control and some kind of information about the conditions inside the circuit after the processing.

The prior art solutions include getting some information about the conditions inside the circuit after performing processing of a pre-calibration circuit using a memory. This calibration is done each time the electronic device (e.g., mobile phone) is turned on. During the calibration, the calibration circuit is used to find the switch setting to achieve one predefined frequency at certain conditions (temperature, etc.). Using this information one can define other switch settings to find other frequency bands (if needed) with the design information; for example, one change up in a digital tuning setting can change the operation frequency by 50 MHz up. U.S. Pat. No. 6,639,474 B2, "Adjustable Oscillator", by K. Asikainen et al. describes such an example of the pre-calibration circuit.

FIG. 1 shows one example among others of a block diagram for a phase locked loop (PLL) 11a with a digital tuning (pre-calibration) of a voltage controlled oscillator (VCO) 10 providing an output signal 20 with a stabilized frequency, according to the prior art. The control block 15 provides the pre-calibration discussed above by sending a control digital signal 22 to the VCO 10. The rest of the PLL 11a is conventional. Typically, it comprises an N-divider 12 (a frequency of the output signal 20 is divided by a pre-selected number N generating an output frequency signal 40), a phase detector 14 utilizing a reference frequency signal 48 and a low pass filter 16 in a feedback loop to the VCO 10. The phase detector 14 provides a dc voltage proportional to the frequency difference of an output frequency signal 40 (indicative of an VCO oscillator frequency $f_{osc}$) and the reference frequency signal 48 (having a frequency $f_{ref}$) to the VCO 10 after filtering by the low pass filter 16.

DISCLOSURE OF THE INVENTION

The object of the present invention is to provide a methodology for a component/system level design of an adaptive radio receiver in electronic communication devices (e.g., mobile phones) by providing a digital tuning of a voltage controlled oscillator as a seamless part of a phase locked loop excluding the need of a prior art pre-calibration. This type of the digital tuning also allows to use multiple bands in a more secure way than in the prior art. That is because the calibration and the frequency band selection are done at the same time when the connection is made and the reference frequency is defined according to the system needs.

According to a first aspect of the invention, a method for providing a digital tuning of a voltage controlled oscillator of a phase locked loop in an electronic communication device comprises the steps of: providing an output frequency signal and a further output frequency signal to a first phase detector and to a second phase detector, respectively, wherein the output frequency signal is an output signal of the voltage controlled oscillator divided by a pre-selected number (N) in a frequency domain and the further output frequency signal is the output signal divided by a further pre-selected number (M) in the frequency domain; generating a first error signal by the first phase detector used for a normal phase locked loop operation providing a feedback control of the voltage controlled oscillator and generating a second error signal by the second phase detector; and providing the second error signal or a scaled second error signal, which is the second error signal multiplied by a predefined scaling factor, to an up/down counter for providing the digital tuning of the voltage controlled oscillator of the phase locked loop.

According further to the first aspect of the invention, the pre-selected number (N) may be equal to the further pre-selected number (M).

Further according to the first aspect of the invention, the pre-selected number (N), the further pre-selected number (M) or both the pre-selected number (N) and the further pre-selected number (M) may be integers of at least a value of one.

Still further according to the first aspect of the invention, the multiplication of the second error signal may be performed by a scaling block.

According further to the first aspect of the invention, the division by the pre-selected number (N) may be performed by an N divider and, if the pre-selected number (N) is not equal to the further pre-selected number (M), the division by the further pre-selected number (M) may be performed by an M divider.

According still further to the first aspect of the invention, the error signal generated by the second error detector may be zero if an oscillation frequency ($f_{osc}$) of the output signal differs from a reference frequency ($f_{ref}$) of the reference frequency signal by less than a predetermined value.

According further still to the first aspect of the invention, the first error signal, after optionally being filtered through a low-pass filter thus generating a filtered first error signal, may be provided to the voltage controlled oscillator. Still further, the method may further comprise the step of: providing, in response to the second error signal or to the scaled second error signal, a control digital signal to the voltage controlled oscillator of the phase locked loop for providing the digital tuning. Yet further still, the output signal may be generated by the voltage controlled oscillator in response to the first error signal or optionally to a filtered first error signal, and in response to the control digital signal.

According yet further still to the first aspect of the invention, the electronic communication device may be a portable communication device, a mobile electronic device or a mobile phone. Yet further, the electronic communication device may be a transmitter or a receiver.

Yet still further according to the first aspect of the invention, if the pre-selected number (N) is equal to the further pre-selected number (M), the first and second error signals may be generated in response to a reference frequency signal which is provided to both the first and the second phase detectors, and, if the pre-selected number (N) is not equal to the further pre-selected number (M), the reference frequency signal may be provided to the first phase detector and a further reference frequency signal may be provided to the second phase detector.

Still yet further according to the first aspect of the invention, a dead zone of the second phase detector, where the second error signal equals to zero, may have an upper frequency boundary which is equal to a detecting range in a frequency domain of the first phase detector such that at any given time only one of the two phase detectors has a non-zero output signal, that is the first error signal or the second error signal.

According yet still further to the first aspect of the invention, the first phase detector may operate during a time frame and the second phase detector may operate during a further time frame, wherein the time frame and the further time frame do not overlap.

According to a second aspect of the invention, an electronic communication device with a digital tuning of a voltage controlled oscillator of a phase locked loop comprises: a voltage controlled oscillator, responsive to a control digital signal, for providing an output signal; a first phase detector, responsive to an output frequency signal, for providing a first error signal used for a normal phase locked loop operation providing a feedback control of the voltage controlled oscillator, wherein the output frequency signal is an output signal divided by a pre-selected number (N) in a frequency domain; a second phase detector, responsive to a further output frequency signal, for providing a second error signal, wherein the further output frequency signal is the output signal divided by a further pre-selected number (M) in the frequency domain; and an up/down counter, responsive to the second error signal or to a scaled second error signal equal to the second error signal multiplied by a predefined scaling factor, for providing the digital tuning of the voltage controlled oscillator.

According further to the second aspect of the invention, the pre-selected number (N) may be equal to the further pre-selected number (M).

Further according to the second aspect of the invention, the pre-selected number (N), the further pre-selected number (M) or both the pre-selected number (N) and the further pre-selected number (M) may be integers of at least a value of one;

Still further according to the second aspect of the invention, the multiplication of the second error signal may be performed by a scaling block.

According further to the second aspect of the invention, the division by the pre-selected number (N) may be performed by an N divider and, if the pre-selected number (N) is not equal to the further pre-selected number (M), the division by the further pre-selected number (M) may be performed by an M divider.

According still further to the second aspect of the invention, the error signal generated by the second error detector may be zero if an oscillation frequency ($f_{osc}$) of the output signal differs from a reference frequency ($f_{ref}$) of the reference frequency signal by less than a predetermined value.

According further still to the second aspect of the invention, the first error signal, after optionally being filtered through a low-pass filter thus generating a filtered first error signal, may be provided to the voltage controlled oscillator. Still further, in response to the second error signal or to the scaled second error signal, a control digital signal may be provided to the voltage controlled oscillator of the phase locked loop for providing the digital tuning. Yet still further, the output signal may be generated by the voltage controlled oscillator in response to the first error signal or optionally to a filtered first error signal, and in response to the control digital signal.

According yet further still to the second aspect of the invention, the electronic communication device may be a portable communication device, a mobile electronic device or a mobile phone. Still further, the electronic communication device may be a transmitter or a receiver.

Yet still further according to the second aspect of the invention, if the pre-selected number (N) is equal to the further pre-selected number (M), the first and second error signals may be generated in response to a reference frequency signal which is provided to both the first and the second phase detectors, and, if the pre-selected number (N) is not equal to the further pre-selected number (M), the reference frequency signal may be provided to the first phase detector and a further reference frequency signal may be provided to the second phase detector.

Still yet further according to the second aspect of the invention, a dead zone of the second phase detector, where the second error signal equals to zero, may have an upper frequency boundary which is equal to a detecting range in a frequency domain of the first phase detector such that, at any given time only one of the two phase detectors has a non-zero output signal, that is the first error signal or the second phase signal.

According yet still further to the second aspect of the invention, the first phase detector may operate during a time frame and the second phase detector may operate during a further time frame, wherein the time frame and the further time frame do not overlap.

BRIEF DESCRIPTION OF THE DRAWINGS

For a better understanding of the nature and objects of the present invention, reference is made to the following detailed description taken in conjunction with the following drawings, in which:

FIGS. 4a, 4b, and 4c are graphs demonstrating an a performance of a first phase detector (FIG. 4a), of a second phase detector (FIG. 4b), and the joint performance of the first and second phase detectors (FIG. 4c), according to the present invention;

FIG. 5a is a graph demonstrating a first phase detector output voltage simulated results for 3 cases: no locking (case 1), locking (case 2), locking with an initial VCO frequency closer to a desired (reference) frequency than in case 2, according to the present invention.

BEST MODE FOR CARRYING OUT THE INVENTION

The present invention provides a new methodology for a component/system level design of an adaptive radio receiver in electronic communication devices by providing an automatic digital tuning of a voltage controlled oscillator of a phase locked loop (PLL) instead of a prior art pre-calibration. The electronic communication device can be, e.g., a portable communication device, a mobile electronic device or a mobile phone.

This invention uses a normal PLL operation in setting the switches to achieve a normal PLL performance for frequency locking and it does not need any additional pre-calibration required by the prior art (e.g., see block 15 in FIG. 1) to account for different temperatures or any other extreme conditions. If the current switch setting does not allow the locking, i.e., the VCO output signal frequency is still far away from a reference (desired) frequency, the PLL "coarse" tuning will cause the switch condition to change and bring the frequency within a reasonable range using an additional phase detector PD2 loop.

According to the present invention, the PLL operation can be separated into two parts using phase detectors PD1 and PD2. At the first predefined time frame the PD2 tunes the frequency by changing the counter values, while the PD1 output is forced to an initial voltage. At the second time frame the PD2 output keeps the value just defined and the PD1 output starts a PLL process.

On-chip design of a VCO now almost always includes switchable capacitors as a part of the process variation compensation or/and band selection. This invention uses the PLL in a way that the correct switch setting is found always in a normal operation, meaning the pre-calibration phase is removed. This reduces the chip size because the calibration circuit is not needed and because the memory where the correct switch setting is now saved is also not needed.

The present invention obviates the need of extra functionality, which is in a form of the pre-calibration, and it removes the need for an extra pre-calibration circuit in the receiver as required in the prior art. The invention makes the process variation calibration seamless to the other parts of the phone, reducing the possibility of errors in the phone function. The invention can be applied, e.g., to the adaptive receiver of a mobile station or a base station facilitating cost reduction and robustness.

Figure 1:
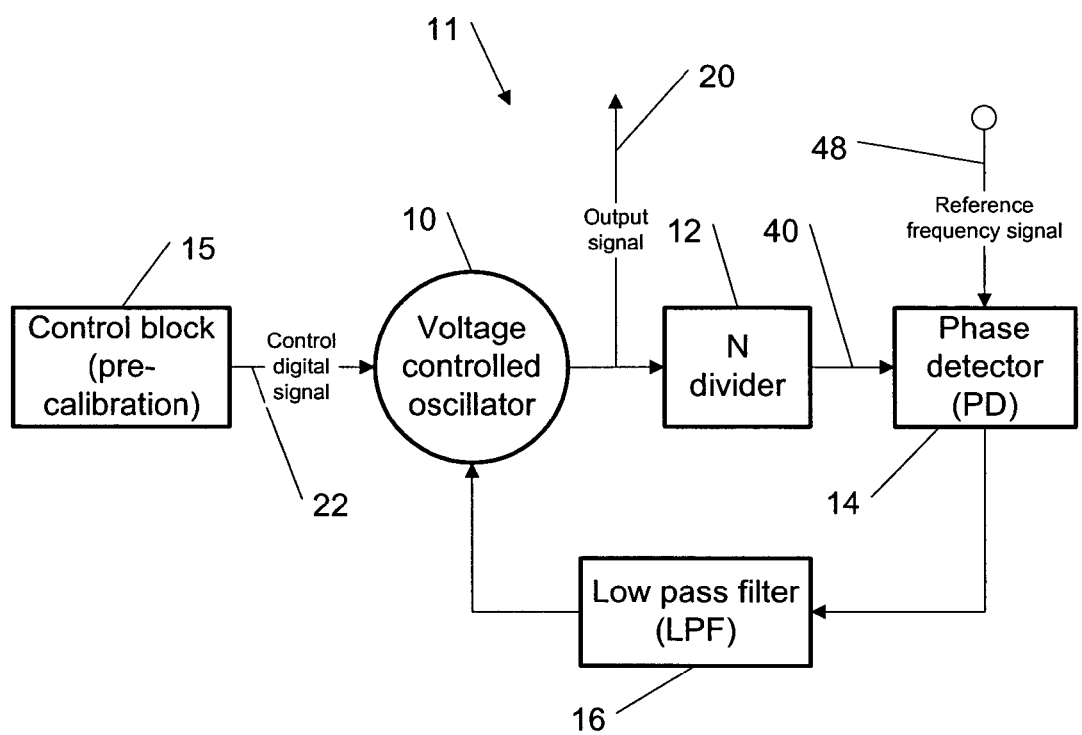
FIG. 1 is a block diagram for a phase locked loop with a digital tuning (pre-calibration) of a voltage controlled oscillator, according to the prior art.
Figure 2:
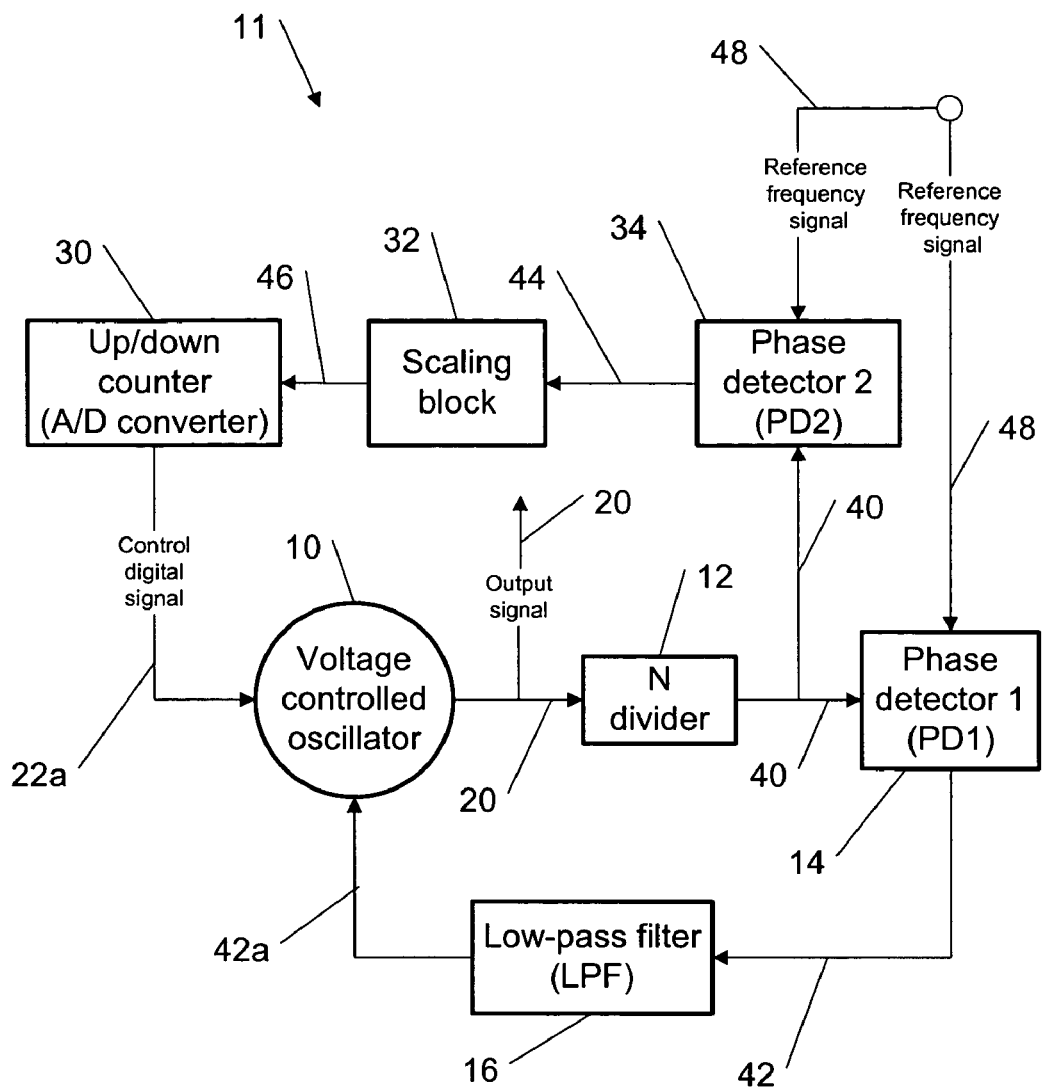
FIG. 2 is a block diagram for a phase locked loop with a digital tuning of a voltage controlled oscillator using two phase detectors with identical input signal frequencies, according to the present invention.

FIG. 2 shows one example among others of a block diagram for a phase locked loop (PLL) 11 with a digital tuning of the voltage controlled oscillator 10 using a first phase detector 14 and a second phase detector 34 (PD1 and PD2, respectively) with identical input signal frequencies (see signal 40 described above in FIG. 1), according to the present invention.

A first error signal 42 generated by the first phase detector 14 is used for a normal phase locked loop operation providing a feedback control of the voltage controlled oscillator 10 as in the prior art shown in FIG. 1. However, FIG. 2 contains several extra blocks (having a small physical size compared to block 15), according to the present invention, needed instead of the control block 15 of the conventional PLL shown in FIG. 1 for automatic tuning to eliminate the prior art pre-calibration procedure. These new blocks include the second phase detector 34 mentioned above, a scaling block 32 and an up/down counter (or A/D converter) 30.

According to the present invention, the second phase detector 34 can have a different performance than the first phase detector 14, as discussed below regarding FIGS. 4a, 4b and 4c. A second error signal 44 generated by the second phase detector 34 can be optionally scaled (up or down) by the scaling block 32 (i.e., multiplied by a predefined scaling factor) generating a scaled second error signal 46, and providing the signal 46 to an up/down counter 30 for performing said digital automatic pre-calibration tuning of the voltage controlled oscillator 10 of said phase locked loop 11.

The up/down counter 30 is a digital block, which just changes the output digital word up or down in response to the scaled second error signal 46 from the scaling block 32, wherein the signal 46 is indicative of the output (the second error signal 44) from the PD2 34 (the sign of the signal 44 indicates if the wanted oscillator $f_{osc}$ is larger or smaller than the reference frequency $f_{ref}$). For example, counting up or down in binary counter means that the output bit sequence is changed from 001 to 010 (up) or 000 (down) thus changing the counter 30 output to the next or previous digital output between 000 to 111.

The blocks 30 and 32 can be implemented using conventional components. For example, one possible implementation of the up/down counter 30 is Model 74193 manufactured by Texas Instruments (e.g., see TTL Data Book for Design Engineers, TI, Inc. Courtesy of Texas Instruments, copy right 1974). The scaling block 32 can be any type of a circuitry which is needed to scale the analog/digital PD2 34 output (the signal 44) to match the performance of the block 30. The scaling block 32 can be an active transistor circuit, or just a resistive voltage divider. The technology of the PD1 14 and PD2 34 is well-known in the art.

Figure 3:
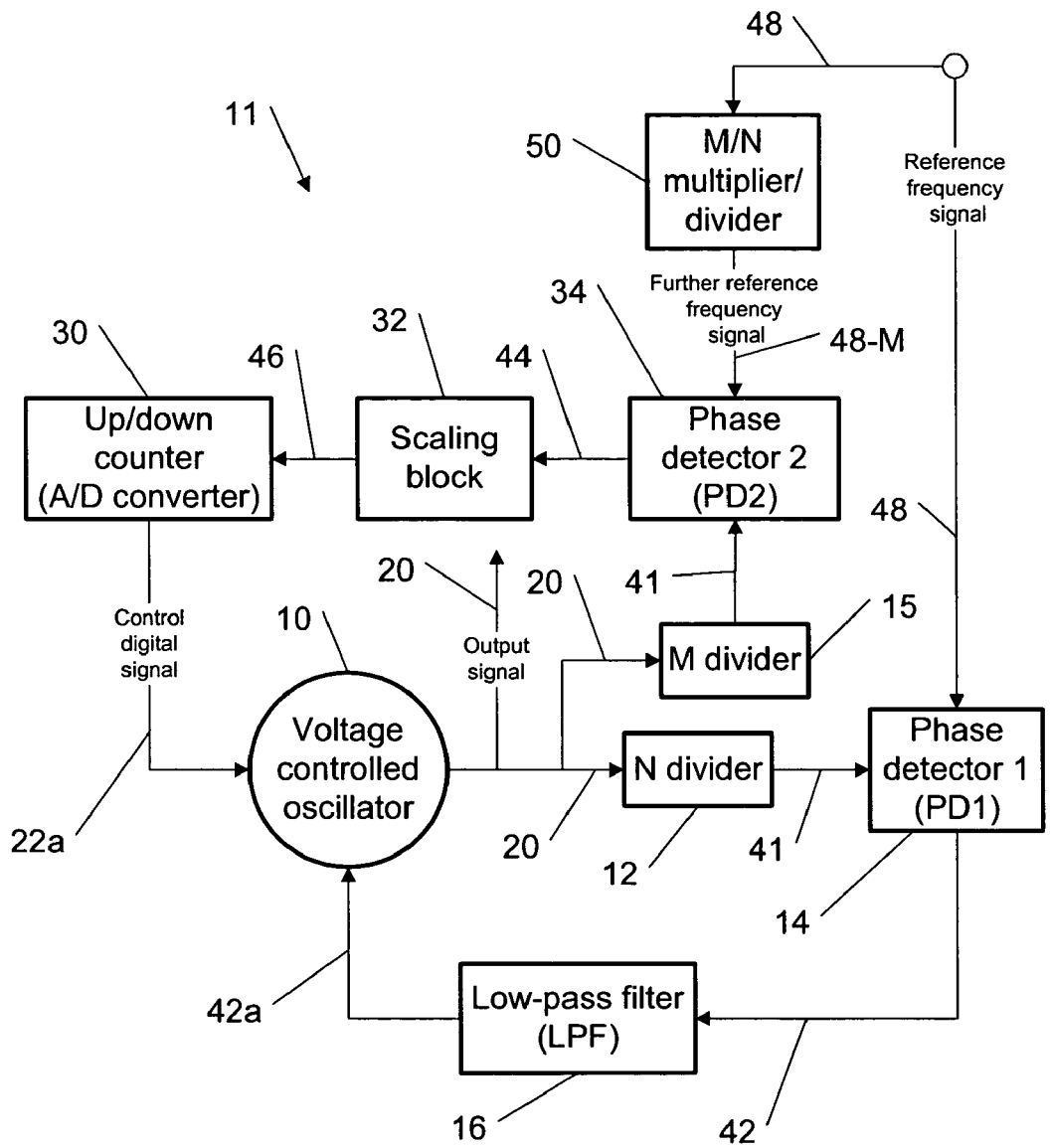
FIG. 3 is a block diagram for a phase locked loop with a digital tuning of a voltage controlled oscillator using two phase detectors with different input signal frequencies, according to the present invention.

In the example of FIG. 2, though the second phase detector 34 can have a different performance than the first phase detector 14, the input signals 40 and 48 are the same. A different situation is shown in FIG. 3. FIG. 3 shows another example among others of a block diagram for a phase locked loop (PLL) 11 with a digital tuning of the voltage controlled oscillator 10 using the first phase detectors 14 and the second phase detector 34 (PD1 and PD2, respectively) with different input signal frequencies for these detectors 14 and 34 (see the output frequency signal 40 described above and a further output frequency signal 41), according to the present invention. As mentioned earlier the output frequency signal 40 is an output signal 20 of the voltage controlled oscillator 10 divided by a pre-selected number N in a frequency domain using an N divider 12 and similarly in FIG. 3 said further output frequency signal 41 is the output signal 20 divided by a further pre-selected number M in the frequency domain using an M divider 15. Also, as shown in FIG. 3, an additional M/N multiplier/divider 50 can be used for providing to the second phase detector 34 a further reference frequency signal 48-M (the signal 48-M is generated from the reference frequency signal 48 by the block 50). It is noted, that, in general, both N and M can be fractional, according to the present invention.

FIGS. 4a, 4b and 4c show one example among others of a comparative performance of a first phase detector PD1 14 (FIG. 4a), of a second phase detector PD2 34 (FIG. 4b), and the joint performance of the first and second phase detectors 14 and 34 (FIG. 4c), according to the present invention. In particular, phase detector output currents are plotted as a function of a phase difference, noted as $\theta_{diff}$, between the reference frequency (e.g., signals 48 and 48-M) and the VCO 10 oscillator frequency (indicated by the signals 40 and 41).

The second phase detector PD2 34 can be different than the conventional phase detector PD1 14 in a sense that the output of the PD2 34 can be zero around the reference frequency (shown as zero frequency in FIG. 4b) thus having a "dead-zone". This means that the phase difference area covered by the PD1 14 is not covered by the PD2 34. If someone decides to use a dead-zone in the PD design (shown, e.g., for the PD2 34) it can be done in such a way that the PD2 34 is not active when the PD1 14 is and vice versa, so that there is no need for an additional clock for timing and the two detectors 14 and 34 are complimentary to each other. For example, if the dead-zone of the PD2 34 is 100 MHz, the PD1 14 detecting frequency range is also 100 MHz.

As it is pointed out above, the first phase detector PD1 14 is a conventional type of a phase detector, having no offset at the output current when the VCO frequency is close to the reference frequency, shown as the zero-current-area (e.g., the area where the PLL is locked) in FIG. 4a. However, as also pointed out above, the PD2 34 has a dead-zone, e.g., an offset at the reference frequency close to the VCO 10 oscillation frequency as also shown in FIG. 4b. Thus the digital part of the tuning does not change while the VCO 10 is locked at a certain wanted frequency band and the tuning is done with the PD1 14. Similar function can be achieved also if the whole PLL 11 operation is divided into time frames. According to the present invention, the PLL 11 operation can be separated into two parts using phase detectors PD1 14 and PD2 34. At the first predefined time frame the PD2 34 tunes the frequency by changing the counter (up/down counter 30) values (providing a coarse tuning), while the PD1 14 output (signal 42) is forced to an initial voltage. At the second time frame the PD2 34 output (the signal 44) keeps the value just defined and the PD1 14 output performs a fine tuning. Means to achieve the operational state of not having overlapping PD1 14 and PD2 34 functions can be accomplished, e.g., by providing clocking to the phase detectors 14 and 34. This way only one PD (14 or 34) operates in a certain time frame.

FIG. 5a shows an example of an output voltage of the first phase detector 14 simulated for 3 cases: no locking (case 1), locking (case 2), locking with an initial VCO frequency closer to a desired frequency than in case 2, according to the present invention. Simulated results are generated with the help of Agilent ADS co-simulation test bench including the components shown in FIG. 2 with some simplifications. The PLL 11 of FIG. 2 with the PD2 34 identical to the PD1 14 with no "dead-zone" and no frequency division (N=1) was used for the simulation. The scaling block 32 was a standard filter/resistor circuit and the up/down counter 30 was made, for simplicity, as an up-counter out of three J/K flip-flops. The locking can be seen (see cases 2 and 3) if the PD1 14 output voltage (the signal 42 in FIG. 2) is saturated after a transition time. Three curves from the top can be described as follows.

Case 1 (upper curve). The PD1 14 output (the signal 42) is generated without the up/down counter 30 and the $f_{ref}$ (the reference frequency of the signal 48) is not inside the VCO 10 oscillation range with a constant switch setting (e.g., not inside the PD1 14 frequency range). PD2 34 is not active, the wanted signal with a desired frequency $f_{ref}$ and the signal 20 with a frequency $f_{osc1}$ provided by the VCO 10 are so far from each other, that the PLL 11 locking is not possible.

Case 2 (middle curve). The PD1 14 output (the signal 42) is generated with the help of the up/down counter 30 and the $f_{ref}$ (the reference frequency of the signal 48) is inside the VCO 10 oscillation range which is now defined by the PD1 14 and PD2 34 frequency ranges. Now the PD2 34 is active and the digital tuning is used to move the frequency $f_{osc2}$ of the output signal 20 closer to the frequency $f_{ref}$. When the frequency $f_{osc2}$ of the VCO output signal 20 is close enough to $f_{ref}$, the PD1 14 fine-tunes the frequency of the VCO output signal 20 $f_{osc2}$ to the wanted frequency with the help of the PLL locking.

Case 3. Similar to case 2, but with the PD1 14 output signal frequency $f_{osc3}$ closer to the oscillator frequency $f_{osc}$: $|f_{osc3}-f_{osc}|<|f_{osc2}-f_{osc}|$. This means faster PLL locking, because the initial condition is closer to locking.

Figure 5B:
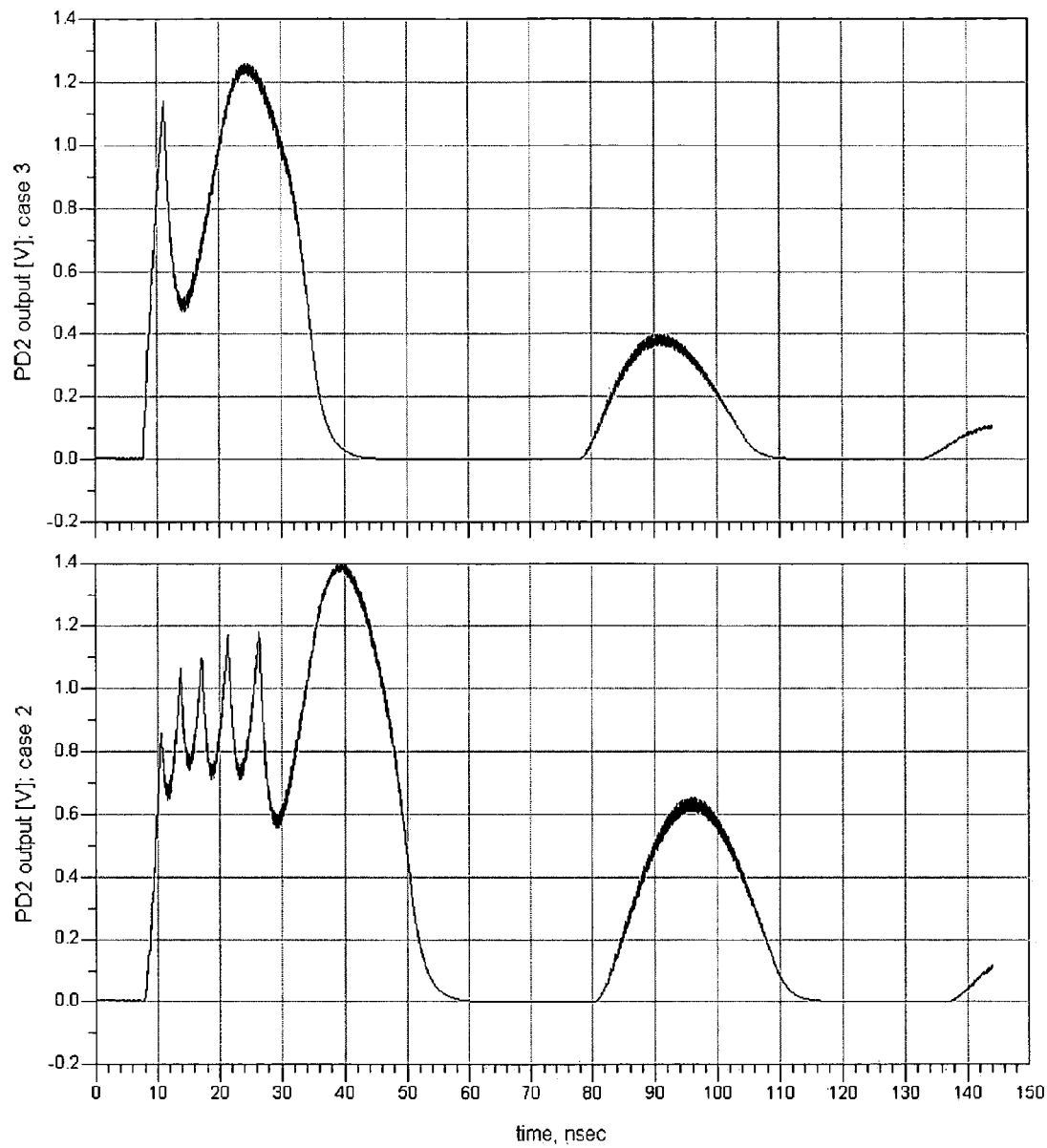
FIG. 5b is a graph demonstrating a second phase detector output voltage simulated results for the cases 2 and 3 of FIG. 5a, according to the present invention.

FIG. 5b shows an example of a second phase detector output voltage simulated results (using the same technique and conditions as in FIG. 5a) for the cases 2 and 3 of FIG. 5a as a function of time. In case 3 (an upper curve) the PD2 34 output (the signal 44) gives two rising edges to the up/down counter (meaning two digital word changes). In case 2 (a lower curve) the PD2 34 output (the signal 44) gives five rising edges (the level 1 is needed to activate counting) and thus five digital word changes take place. The tuning is faster in case 3 than in case 2 as expected and as evident from FIG. 5b.

What is claimed is:

1. A method for providing a digital tuning of a voltage controlled oscillator of a phase locked loop in an electronic communication device, comprising the steps of:

providing an output frequency signal and a further output frequency signal to a first phase detector and to a second phase detector, respectively, wherein said output frequency signal is an output signal of the voltage controlled oscillator divided by a pre-selected number (N) in a frequency domain and said further output frequency signal is the output signal divided by a further pre-selected number (M) in the frequency domain;

generating a first error signal by the first phase detector used for a normal phase locked loop operation providing a feedback control of the voltage controlled oscillator and generating a second error signal by the second phase detector; and providing said second error signal or a scaled second error signal, which is said second error signal multiplied by a predefined scaling factor, to an up/down counter for providing said digital tuning of the voltage controlled oscillator of said phase locked loop.

2. The method of claim 1, wherein said pre-selected number (N) is equal to said further pre-selected number (M).

3. The method of claim 1, wherein said pre-selected number (N), said further pre-selected number (M), or both said pre-selected number (N) and said further pre-selected number (M) are integers of at least a value of one.

4. The method of claim 1, wherein said multiplication of said second error signal is performed by a scaling block.

5. The method of claim 1, wherein said division by said pre-selected number (N) is performed by an N divider and, if said pre-selected number (N) is not equal to said further pre-selected number (M), said division by said further pre-selected number (M) is performed by an M divider.

6. The method of claim 1, wherein the error signal generated by the second error detector is zero if an oscillation frequency ($f_{osc}$) of the output signal differs from a reference frequency ($f_{ref}$) of the reference frequency signal by less than a predetermined value.

7. The method of claim 1, wherein said first error signal, after optionally being filtered through a low-pass filter thus generating a filtered first error signal, is provided to the voltage controlled oscillator.

8. The method of claim 7, further comprising the step of: providing, in response to the second error signal or to the scaled second error signal, a control digital signal to the voltage controlled oscillator of said phase locked loop for providing said digital tuning.

9. The method of claim 8, wherein said output signal is generated by the voltage controlled oscillator in response to said first error signal or optionally to a filtered first error signal, and in response to the control digital signal.

10. The method of claim 1, wherein said electronic communication device is a portable communication device, a mobile electronic device or a mobile phone.

11. The method of claim 1, wherein if said pre-selected number (N) is equal to said further pre-selected number (M), said first and second error signals are generated in response to a reference frequency signal which is provided to both the first and the second phase detectors, and if said pre-selected number (N) is not equal to said further pre-selected number (M), said reference frequency signal is provided to the first phase detector and a further reference frequency signal is provided to the second phase detector.

12. The method of claim 1, wherein said electronic communication device is a transmitter or a receiver.

13. The method of claim 1, wherein a dead zone of the second phase detector, where the second error signal equals to zero, has an upper frequency boundary which is equal to a detecting range in a frequency domain of the first phase detector such, that at any given time only one of said two phase detectors has a non-zero output signal, that is the first error signal or the second error signal.

14. The method of claim 1, wherein the first phase detector operates during a time frame and the second phase detector operates during a further time frame, wherein said time frame and said further time frame do not overlap.

15. An electronic communication device with a digital tuning of a voltage controlled oscillator of a phase locked loop, comprising:
 a voltage controlled oscillator, responsive to a control digital signal, for providing an output signal;
 a first phase detector, responsive to an output frequency signal, for providing a first error signal used for a normal phase locked loop operation providing a feedback control of the voltage controlled oscillator, wherein said output frequency signal is an output signal divided by a pre-selected number (N) in a frequency domain;
 a second phase detector, responsive to a further output frequency signal, for providing a second error signal, wherein said further output frequency signal is the output signal divided by a further pre-selected number (M) in the frequency domain; and
 an up/down counter, responsive to said second error signal or to a scaled second error signal equals to said second error signal multiplied by a predefined scaling factor, for providing said digital tuning of the voltage controlled oscillator.

16. The electronic communication device of claim 15, wherein said pre-selected number (N) is equal to said further pre-selected number (M).

17. The electronic communication device of claim 15, wherein said pre-selected number (N), said further pre-selected number (M), or both said pre-selected number (N) and said further pre-selected number (M) are integers of at least a value of one.

18. The electronic communication device of claim 15, wherein said multiplication of said second error signal is performed by a scaling block.

19. The electronic communication device of claim 15, wherein said division by said pre-selected number (N) is performed by an N divider and, if said pre-selected number (N) is not equal to said further pre-selected number (M), said division by said further pre-selected number (M) is performed by an M divider.

20. The electronic communication device of claim 15, wherein the error signal generated by the second error detector is zero if an oscillation frequency ($f_{osc}$) of the output signal differs from a reference frequency ($f_{ref}$) of the reference frequency signal by less than a predetermined value.

21. The electronic communication device of claim 15, wherein said first error signal, after optionally being filtered through a low-pass filter thus generating a filtered first error signal, is provided to the voltage controlled oscillator.

22. The electronic communication device of claim 21, wherein in response to the second error signal or to the scaled second error signal, a control digital signal is provided to the voltage controlled oscillator of said phase locked loop for providing said digital tuning.

23. The electronic communication device of claim 22, wherein said output signal is generated by the voltage controlled oscillator in response to said first error signal or optionally to a filtered first error signal, and in response to the control digital signal.

24. The electronic communication device of claim 15, wherein said electronic communication device is a portable communication device, a mobile electronic device or a mobile phone.

25. The electronic communication device of claim 15, wherein if said pre-selected number (N) is equal to said further pre-selected number (M), said first and second error signals are generated in response to a reference frequency signal which is provided to both the first and the second phase detectors, and if said pre-selected number (N) is not equal to said further pre-selected number (M), said reference frequency signal is provided to the first phase detector and a further reference frequency signal is provided to the second phase detector.

26. The electronic communication device of claim 15, wherein said electronic communication device is a transmitter or a receiver.

27. The electronic communication device of claim 15, wherein a dead zone of the second phase detector, where the second error signal equals to zero, has an upper frequency boundary which is equal to a detecting range in a frequency domain of the first phase detector such, that at any given time only one of said two phase detectors has a non-zero output signal, that is the first error signal or the second phase signal.

28. The electronic communication device of claim 15, wherein the first phase detector operates during a time frame and the second phase detector operates during a further time frame, wherein said time frame and said further time frame do not overlap.

* * * * *